United States Patent
Zywiak et al.

(10) Patent No.: US 10,346,585 B2
(45) Date of Patent: Jul. 9, 2019

(54) METHOD OF PREDICTING HEAT EXCHANGER BLOCKAGE VIA RAM AIR FAN SURGE MARGIN

(71) Applicant: Hamilton Sundstrand Corporation, Windsor Locks, CT (US)

(72) Inventors: Thomas M. Zywiak, Southwick, MA (US); Tony Ho, Southington, CT (US); Nathan Haggerty, Avon, CT (US)

(73) Assignee: HAMILTON SUNDSTRAND CORPORATION, Windsor Locks, CT (US)

( * ) Notice: Subject to any disclaimer, the term of this patent is extended or adjusted under 35 U.S.C. 154(b) by 598 days.

(21) Appl. No.: 15/049,555

(22) Filed: Feb. 22, 2016

(65) Prior Publication Data

US 2017/0242956 A1    Aug. 24, 2017

(51) Int. Cl.
| | | |
|---|---|---|
| G06F 17/50 | (2006.01) | |
| G05B 23/02 | (2006.01) | |
| B64F 5/60 | (2017.01) | |

(52) U.S. Cl.
CPC ..... G06F 17/5095 (2013.01); G05B 23/0254 (2013.01); G05B 23/0283 (2013.01); B64F 5/60 (2017.01)

(58) Field of Classification Search
CPC .............................. G06F 17/5095; G06F 17/50
See application file for complete search history.

(56) References Cited

U.S. PATENT DOCUMENTS

| | | |
|---|---|---|
| 5,095,714 A | 3/1992 | Adachi |
| 9,097,447 B2 | 8/2015 | Trawicki |
| 9,194,319 B2 | 11/2015 | Mischler |
| 2010/0287907 A1 | 11/2010 | Agrawal |
| 2012/0283963 A1 | 11/2012 | Mitchell et al. |
| 2014/0305610 A1 | 10/2014 | Zywiak |
| 2015/0166186 A1 | 6/2015 | Zywiak |

FOREIGN PATENT DOCUMENTS

| | | | | |
|---|---|---|---|---|
| DE | 102014104917 | * | 4/2013 | ............ G01M 99/00 |
| DE | 102014104917 A1 | | 10/2014 | |
| WO | 2015124889 A1 | | 8/2015 | |

OTHER PUBLICATIONS

Gudmundsson, O., S. Lalot, and J. E. Thorsen. "Comparison of Fouling Detection Methods using Experimental Data." Proc. on Heat Exchanger Fouling and Cleaning X-2013 (2013): 09-14. (Year: 2013).*

(Continued)

*Primary Examiner* — Saif A Alhija
*Assistant Examiner* — Joshua E. Jensen
(74) *Attorney, Agent, or Firm* — Cantor Colburn LLP (57) ABSTRACT

A method and system for predicting heat exchanger blockage in an aircraft is provided. The method includes generating a reduced order model (ROM) that predicts a ram air fan (RAF) surge margin that correlates to a heat exchanger blockage parameter, calculating, using the ROM, a predicted RAF surge margin value using a sensor signal received from a sensor connected to a ram air fan (RAF), calculating the heat exchanger blockage parameter using at least the predicted RAF surge margin value, and reporting, to a user, the heat exchanger blockage parameter that indicates when a heat exchanger blockage condition is present.

17 Claims, 5 Drawing Sheets

(56) References Cited

OTHER PUBLICATIONS

Ghisu, Tiziano, et al. "Robust design optimization of gas turbine compression systems." Journal of Propulsion and power 27.2 (2011 ): 282-295 (Year: 2011).*
Tarabrin, A. P., et al. "An analysis of axial compressors fouling and a cleaning method of their blading." ASME 1996 International Gas Turbine and Aeroengine Congress and Exhibition. American Society of Mechanical Engineers, 1996. (Year: 1996).*
Ingimundardóttir, Helga, and Sylvain Lalot. "Detection of fouling in a cross-flow heat exchanger using wavelets." Heat Transfer Engineering 32.3-4 (2011): 349-357. APA (Year: 2011).*
Jonsson, Gudmundur R., et al. "Use of extended Kalman filtering in detecting fouling in heat exchangers." International journal of heat and mass transfer 50.13-14 (2007): 2643-2655. (Year: 2007).*
Lalot, Sylvain, and Halldór Pálsson. "Detection of fouling in a cross-flow heat exchanger using a neural network based technique." International Journal of Thermal Sciences 49.4 (2010): 675-679. (Year: 2010).*
European Search Report for Application No. 17157208.4-1802 dated Jul. 3, 2017, 11 pages.
Lu, Yunjia et al. "Data-driven model reduction and fault diagnosis for an aero gas turbine engine", 2014 9th IEEE Conference on Industrial Electronics and Applications, IEEE, Jun. 9, 2014, pp. 1936-1941.
O Gudmundsson, et al. "Comparison of Fouling Detection Methods Using Experimental Data", Proceedings of International conference on Heat exchanger Fouling and cleaning, Jun. 14, 2014, pp. 429-436.
Shoaib Shah et al. "On-line fouling detection of aircraft environmental control system cross flow heat exchanger", Mechatronics and Automation, 2009. ICMA 2009. International Conference on, Aug. 1, 2009, pp. 2940-2945.
Wright S, et al. "A review of heat exchanger fouling in the context of aircraft air-conditioning systems, and the potential for electrostatic filtering", Applied Thermal Engineering, Pergamon, Oxford, GB, vol. 29, No. 13, Sep. 1, 2009, pp. 2596-2609.

* cited by examiner

METHOD OF PREDICTING HEAT EXCHANGER BLOCKAGE VIA RAM AIR FAN SURGE MARGIN

BACKGROUND

The subject matter disclosed herein generally relates to heat exchanger blockage detection and, more particularly, to predicting heat exchanger blockage in an aircraft based on other detected values in the aircraft.

In environments which contain high rate of particulates suspended in the air, Foreign Object Debris (FOD) can build up on the aircraft heat exchangers and degrade performance. This blockage can cause highly unstable flow through the Ram Air Fan (RAF) causing it to break (due to fan surge). Currently, some aircrafts require costly regular heat exchanger cleaning at an aggressively conservative schedule to prevent RAF damage because often there is no reliable prognostic of detecting when the ram heat exchangers are blocked with the typical aircraft sensor suite. If the blockage of a heat exchanger can be detected via a scheduled and repeatable prognostic, heat exchanger cleaning can be conducted on as needed basis vastly improving service hours and reducing cost. Further, while the performance of the system may decrease as the heat exchangers becomes blocked, the primary motivating factor to cleaning heat exchangers is preventing the RAF hardware failure.

Accordingly, there is a desire for a method and/or system with which to determine when a heat exchanger blockage has occurred or is projected to occur so that it can be remedied prior to the RAF being negatively impacted by the blockage.

BRIEF DESCRIPTION

According to one embodiment a method for predicting heat exchanger blockage in an aircraft is provided. The method includes generating a reduced order model (ROM) that predicts a ram air fan (RAF) surge margin that correlates to a heat exchanger blockage parameter, calculating, using the ROM, a predicted RAF surge margin value using a sensor signal received from a sensor connected to a ram air fan (RAF), calculating the heat exchanger blockage parameter using at least the predicted RAF surge margin value, and reporting, to a user, the heat exchanger blockage parameter that indicates when a heat exchanger blockage condition is present.

In addition to one or more of the features described above, or as an alternative, further embodiments of the method may include wherein calculating the heat exchanger blockage parameter is calculated by comparing the predicted RAF surge margin value with a threshold RAF surge margin value and a clean RAF surge margin value.

In addition to one or more of the features described above, or as an alternative, further embodiments of the method may include wherein an increase in the predicted RAF surge margin value above the clean RAF surge margin value corresponds to an increase in the heat exchanger blockage parameter.

In addition to one or more of the features described above, or as an alternative, further embodiments of the method may include wherein an increase in the predicted RAF surge margin value above the threshold RAF surge margin value corresponds to the heat exchanger blockage parameter indicating a heat exchanger blockage.

In addition to one or more of the features described above, or as an alternative, further embodiments of the method may include wherein the heat exchanger blockage parameter is calculated by subtracting the predicted RAF surge margin value from the clean RAF surge margin value creating a first value, subtracting the threshold RAF sure margin from the clean RAF surge margin value creating a second value, and dividing the first value by the second value.

In addition to one or more of the features described above, or as an alternative, further embodiments of the method may include wherein generating the ROM includes determining, using a high-fidelity model, a high-fidelity system response over operating conditions during which the RAF surge margin is detected, and creating, using an aircraft system controller, the ROM using the high-fidelity system response, wherein the ROM correlates with heat exchanger blockage.

In addition to one or more of the features described above, or as an alternative, further embodiments of the method may include wherein generating the ROM further includes selecting, from a high-fidelity set of parameters, a sub-set of parameters with high correlation to the heat exchanger blockage parameter, wherein the sub-set of parameters have corresponding sensors in the aircraft system such that measurements from the sensors can be used to generate the predicted RAF surge margin value.

In addition to one or more of the features described above, or as an alternative, further embodiments of the method may include wherein the heat exchanger blockage parameter includes cleaning information for heat exchanger blockage cleaning.

According to another embodiment a system for predicting heat exchanger blockage in an aircraft, the system including a heat exchanger and a corresponds heat exchanger blockage parameter, a ram air fan (RAF) and a corresponding RAF surge margin, and an aircraft system controller including a memory having computer readable instructions, and one or more processors configured to execute the computer readable instructions. The computer readable instructions include generating a reduced order model (ROM) that predicts the RAF surge margin that correlates to the heat exchanger blockage parameter, calculating, using the ROM, a predicted RAF surge margin value using a sensor signal received from a sensor connected to the ram air fan, calculating the heat exchanger blockage parameter using at least the predicted RAF surge margin value, and reporting, to a user, the heat exchanger blockage parameter that indicates when a heat exchanger blockage condition is present.

In addition to one or more of the features described above, or as an alternative, further embodiments of the system may include wherein calculating the heat exchanger blockage parameter is calculated by comparing the predicted RAF surge margin value with a threshold RAF surge margin value and a clean RAF surge margin value.

In addition to one or more of the features described above, or as an alternative, further embodiments of the system may include wherein an increase in the predicted RAF surge margin value above the clean RAF surge margin value corresponds to an increase in the heat exchanger blockage parameter, and In addition to one or more of the features described above, or as an alternative, further embodiments of the system may include wherein an increase in the predicted RAF surge margin value above the threshold RAF surge margin value corresponds to the heat exchanger blockage parameter indicating the heat exchanger blockage condition.

In addition to one or more of the features described above, or as an alternative, further embodiments of the system may include wherein the heat exchanger blockage parameter is calculated by subtracting the predicted RAF surge margin value from the clean RAF surge margin value creating a first value, subtracting the threshold RAF surge margin from the clean RAF surge margin value creating a second value, and dividing the first value by the second value.

In addition to one or more of the features described above, or as an alternative, further embodiments of the system may include wherein generating the ROM includes determining, using a high-fidelity model, a high-fidelity system response over operating conditions during which the RAF surge margin is detected, creating, using an aircraft system controller, the ROM using the high-fidelity system response, wherein the ROM correlates with heat exchanger blockage.

In addition to one or more of the features described above, or as an alternative, further embodiments of the system may include wherein generating the ROM further includes selecting, from a high-fidelity set of parameters, a sub-set of parameters with high correlation to the heat exchanger blockage parameter, wherein the sub-set of parameters have corresponding sensors in the aircraft system such that measurements from the sensors can be used to generate the predicted RAF surge margin value.

In addition to one or more of the features described above, or as an alternative, further embodiments of the system may include wherein the heat exchanger blockage parameter includes cleaning information for heat exchanger blockage cleaning.

According to another embodiment computer program product for predicting heat exchanger blockage in an aircraft is provided. The computer program product including a computer readable storage medium having program instructions embodied therewith. The program instructions executable by a processor to cause the processor to generate a reduced order model (ROM) that predicts a ram air fan (RAF) surge margin that correlates to a heat exchanger blockage parameter, calculate, using the ROM, a predicted RAF surge margin value using a sensor signal received from a sensor connected to a ram air fan (RAF), calculate the heat exchanger blockage parameter using at least the predicted RAF surge margin value, and report, to a user, the heat exchanger blockage parameter that indicates when a heat exchanger blockage condition is present.

In addition to one or more of the features described above, or as an alternative, further embodiments of the computer program product may include, having additional program instructions embodied therewith, the additional program instructions executable by the processor to cause the processor to wherein calculating the heat exchanger blockage parameter is calculated by comparing the predicted RAF surge margin value with a threshold RAF surge margin value and a clean RAF surge margin value, wherein an increase in the predicted RAF surge margin value above the clean RAF surge margin value corresponds to an increase in the heat exchanger blockage parameter, wherein an increase in the predicted RAF surge margin value above the threshold RAF surge margin value corresponds to the heat exchanger blockage parameter indicating a heat exchanger blockage, and wherein the heat exchanger blockage parameter is calculated by subtracting the predicted RAF surge margin value from the clean RAF surge margin value creating a first value, subtracting the threshold RAF sure margin from the clean RAF surge margin value creating a second value, and dividing the first value by the second value.

In addition to one or more of the features described above, or as an alternative, further embodiments of the computer program product may include—having additional program instructions embodied therewith, the additional program instructions executable by the processor to cause the processor to determine, using a high-fidelity model, a high-fidelity system response over operating conditions during which the RAF surge margin is detected, and create, using an aircraft system controller, the ROM using the high-fidelity system response, wherein the ROM correlates with heat exchanger blockage.

In addition to one or more of the features described above, or as an alternative, further embodiments of the computer program product may include, having additional program instructions embodied therewith, the additional program instructions executable by the processor to cause the processor to select, from a high-fidelity set of parameters, a sub-set of parameters with high correlation to the heat exchanger blockage parameter, wherein the sub-set of parameters have corresponding sensors in the aircraft system such that measurements from the sensors can be used to generate the predicted RAF surge margin value.

The foregoing features and elements may be combined in various combinations without exclusivity, unless expressly indicated otherwise. These features and elements as well as the operation thereof will become more apparent in light of the following description and the accompanying drawings. It should be understood, however, that the following description and drawings are intended to be illustrative and explanatory in nature and non-limiting.

BRIEF DESCRIPTION OF THE DRAWINGS

The foregoing and other features, and advantages of the present disclosure are apparent from the following detailed description taken in conjunction with the accompanying drawings in which.

DETAILED DESCRIPTION

As shown and described herein, various features of the disclosure will be presented. Various embodiments may have the same or similar features and thus the same or similar features may be labeled with the same reference numeral, but preceded by a different first number indicating the figure to which the feature is shown. Thus, for example, element "a" that is shown in FIG. X may be labeled "Xa" and a similar feature in FIG. Z may be labeled "Za." Although similar reference numbers may be used in a generic sense, various embodiments will be described and various features may include changes, alterations, modifications, etc. as will be appreciated by those of skill in the art, whether explicitly described or otherwise would be appreciated by those of skill in the art.

Embodiments described herein are directed to creating a reduced order model (ROM) for an aircraft system that predicts a RAF surge margin that positively correlates with a heat exchanger blockage parameter to help detect when the heat exchanger blockage condition is present or is at risk of presenting.

Figure 1:
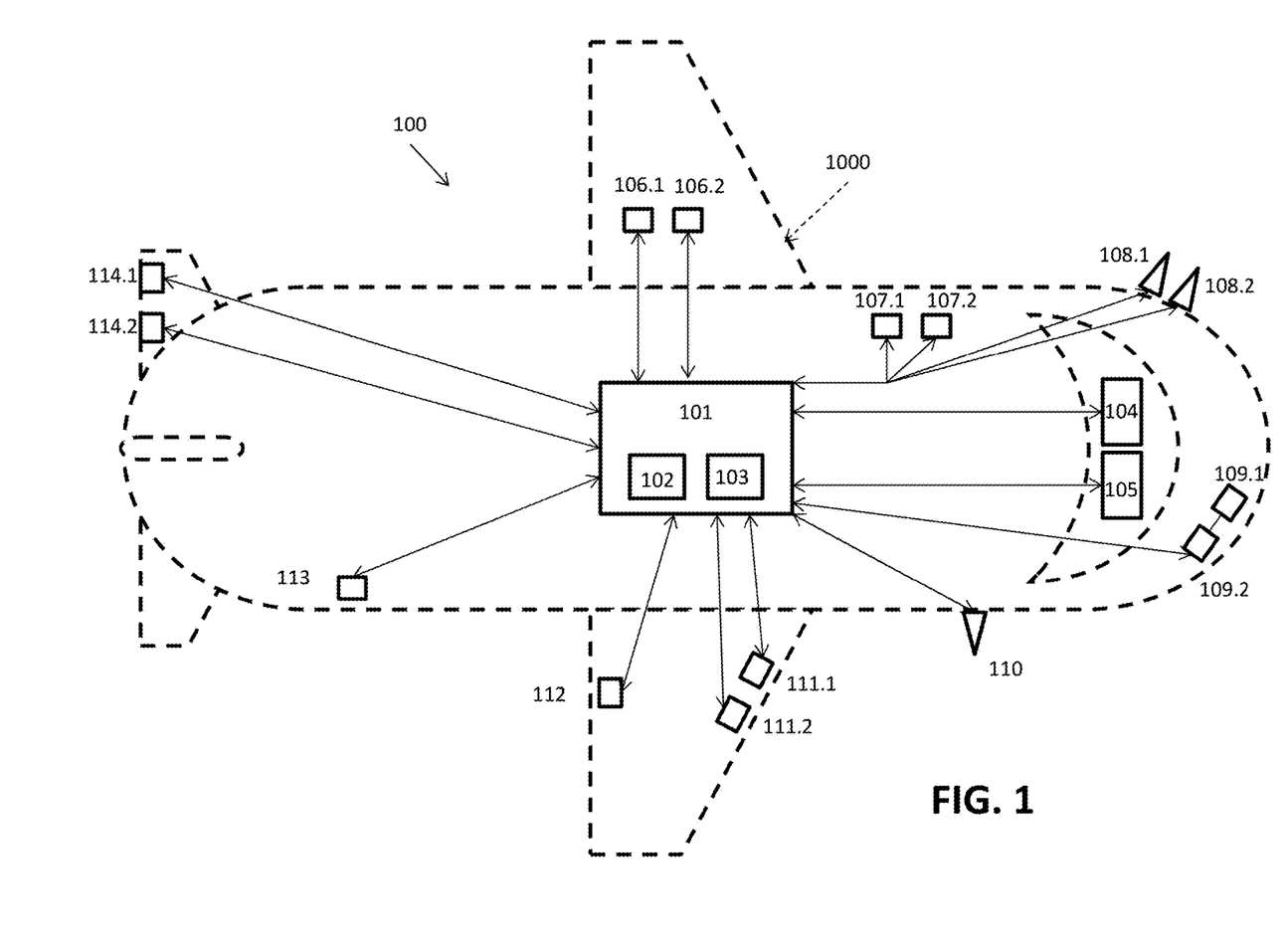
FIG. 1 illustrates a reduced order model (ROM) sensor system to detect aircraft sensor response in an aircraft system in accordance with one or more exemplary embodiments.

For example, turning now to FIG. 1, a reduced order model (ROM) sensor system 100 for detecting and predicting a number of aircraft component values such as predicting heat exchanger blockage among other things in an aircraft 1000 is shown in accordance with one or more embodiments.

According to one or more embodiments, the ROM sensor system 100 includes an aircraft system controller 101 that includes at least one processor 102 and computer readable storage medium 103. The aircraft system controller 101 is connected to a display 104 and an input device 105 that are located in the flight deck of the aircraft system 1000. The aircraft system controller 101 is also connected to a plurality of sensors. The plurality of sensors can be any known sensor type and have any known placement that can be provided in or on an aircraft system 1000.

For example, according to one or more exemplary embodiments, the plurality of sensors can be included within, but are not limited to, Cabin Air Condition systems, Air Data Products and Systems, Electronic flight bag (EFB) Solutions, Engines and Space Sensors, Guidance, Navigation and Control (GNC) sensors and systems, Health and Usage Management Systems (HUMS), Ice Detection and Protection Systems, In-flight Entertainment (IFE) systems, Fire Protection Systems, Mission Data Recorders, Rescue Hoists and Cargo Winch sensors and systems.

Further, according to one or more embodiments, the sensors can also be included are part of other systems such as Actuation Systems, Aerostructures, Air Management Systems, Electric Systems, Engine Components, Engine & Control Systems, Interiors, Intelligence, Surveillance and Reconnaissance (ISR) Systems, Landing Gear, Propeller Systems, Sensors & Integrated Systems, Space Systems, and Wheels & Brakes.

Looking back at FIG. 1 according to one or more embodiments, the sensors can be provided in redundant and non-redundant fashion. For example, sensors 111.1, 111.2 are provided in redundant fashion. In contrast sensor 112 is provided alone. Sensor pairs can be provided at many different positions within the aircraft. For example a sensor pair 106.1, 106.2 are provided in a wing of the aircraft. Similarly sensor pair 114.1, 114.2 is provided in a rear stabilizer. A sensor can also be provided in singular fashion within the fuselage such as sensor 113. The sensors can also be connected to the aircraft system controller 101 in series, parallel, or a combination. For example, sensor pair 107.1, 107.2 is connected to the aircraft system controller 101 using a parallel connection. In contrast, sensor pair 109.1, 109.2 is connected to the aircraft system controller in a series arrangement. Further, sensors can also be placed on the exterior of the aircraft system 1000. For example, a pair of redundant sensors 108.1, 108.2 can be provided near the cockpit. In contract a single sensor 110 can be placed along the outside surface of the fuselage. According to other embodiments, there may be other sensors provided at different locations in other arrangements. Further, the sensors could also be equipped with the ability to communicate with the aircraft system controller by wired and/or wireless communication channels.

Figure 2:
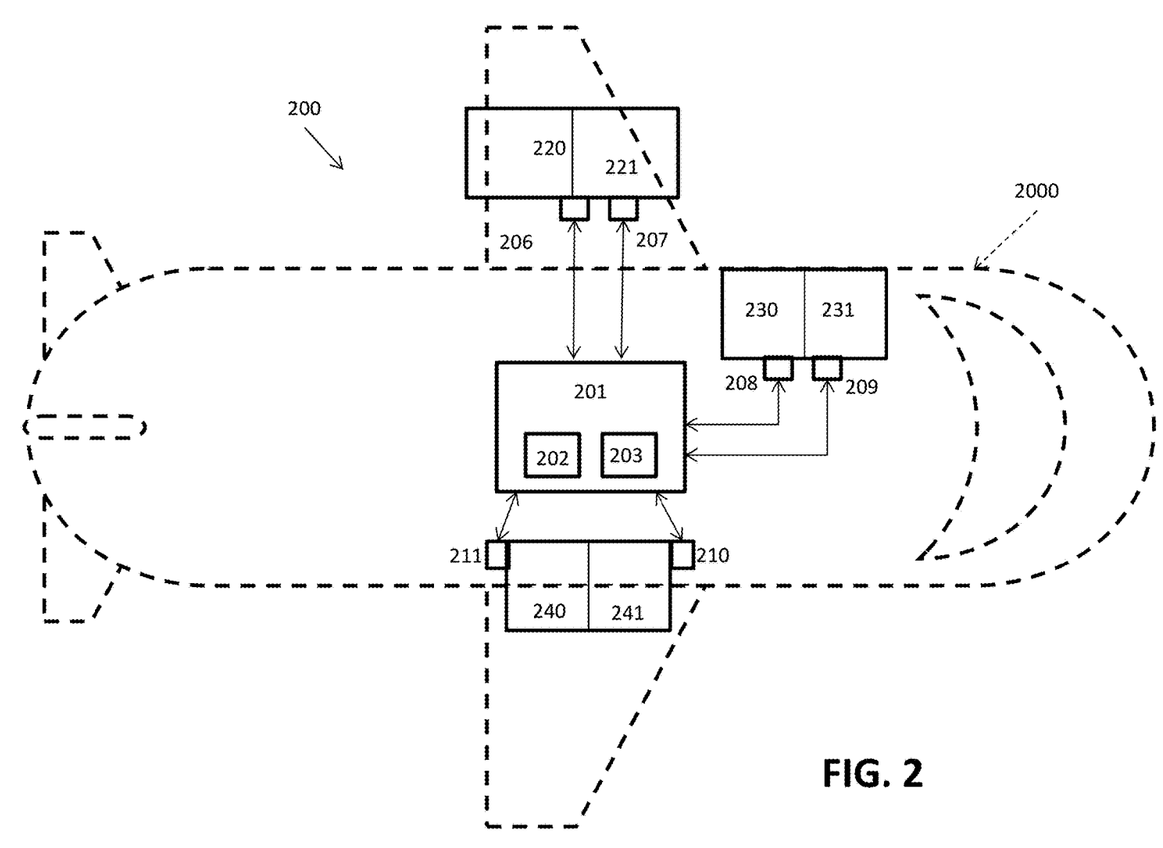
FIG. 2 illustrates a ROM sensor system for predicting heat exchanger blockage in an aircraft in accordance with one or more exemplary embodiments.

Further, turning now to FIG. 2, an example of a system 200 in an aircraft 2000 for specifically detecting and predicting a RAF surge margin, and in turn predicting heat exchanger blockage, is shown. According to one embodiment, the heat exchanger can be a part of an air cycle cooling system and/or vapor cycle system. According to another embodiment, the system 200 as shown may be part of the larger system 100 of FIG. 1. Alternatively, in another embodiment the system 200 may be a stand-alone system within the aircraft 2000 with independent controller and sensor elements.

Specifically, FIG. 2 illustrates a ROM sensor system 200 for predicting heat exchanger blockage in an aircraft 2000 in accordance with one or more exemplary embodiments. According to one or more embodiments, the ROM sensor system 200 includes an aircraft system controller 201 that includes at least one processor 202 and computer readable storage medium 203. The aircraft system controller 201 may be connected to a display and an input device that are located in the flight deck of the aircraft system 2000. The aircraft system controller 201 is also connected to a plurality of sensors. The plurality of sensors can be any known sensor type and have any known placement that can be provided in or on an aircraft system 2000.

For example, according to one or more exemplary embodiments, the plurality of sensors can be included in and around heat exchanger elements and Ram Air Fans (RAFs) connected to the heat exchangers. Specifically, a heat exchanger 220 and RAF 221 can be provided in a wing portion of the aircraft 2000. Further, the heat exchanger 220 and RAF 221 can be provided such that they at least a portion of either element is provided on an outside surface of the aircraft 2000. The heat exchanger 220 and RAF 221 can have sensors 206 and 207 connected on, near, or within each or just one of the elements. The sensors can include any type of known sensor. For example the sensors can include sensors that can sense and take measurements of, for example, air flow, temperature, movement, sound, electricity, chemicals, or some combination.

Similarly, according to another embodiment, a heat exchanger 230 and RAF 231 can be provided completed within the fuselage of the aircraft 2000. The heat exchanger 230 and RAF 231 can have sensors 208 and 209 that are connected to the heat exchanger 240 and RAF 231. The sensors 208 and 209 are also connected to the aircraft system controller 201 and transmit measurements taken from the heat exchanger 230 and/or RAF 231 back to the aircraft system controller 201.

Further, according to another embodiment, a heat exchanger 240 and RAF 241 can be provided in both a wing portion and a fuselage portion of the aircraft 2000. The heat exchanger 240 and RAF 241 can have sensors 211 and 210 connected on, near, or within each or just one of the elements. These sensors 211 and 210 are connected to aircraft system controller 201 and transmit measurements taken from the heat exchanger 240 and/or RAF 241 back to the aircraft system controller 201.

According to one or more embodiments, the aircraft system controller 201 receives the sensor signals from the sensors associated with the RAF and heat exchanger. The aircraft system controller 201 stores the received sensor signals in the computer readable storage medium 203. Further, the aircraft system controller 201 can process the signals using the processor 202 to predict heat exchanger blockage in an aircraft. The method implemented using the processor is able to predict the blockage using predicted RAF surge margin values.

Figure 3:
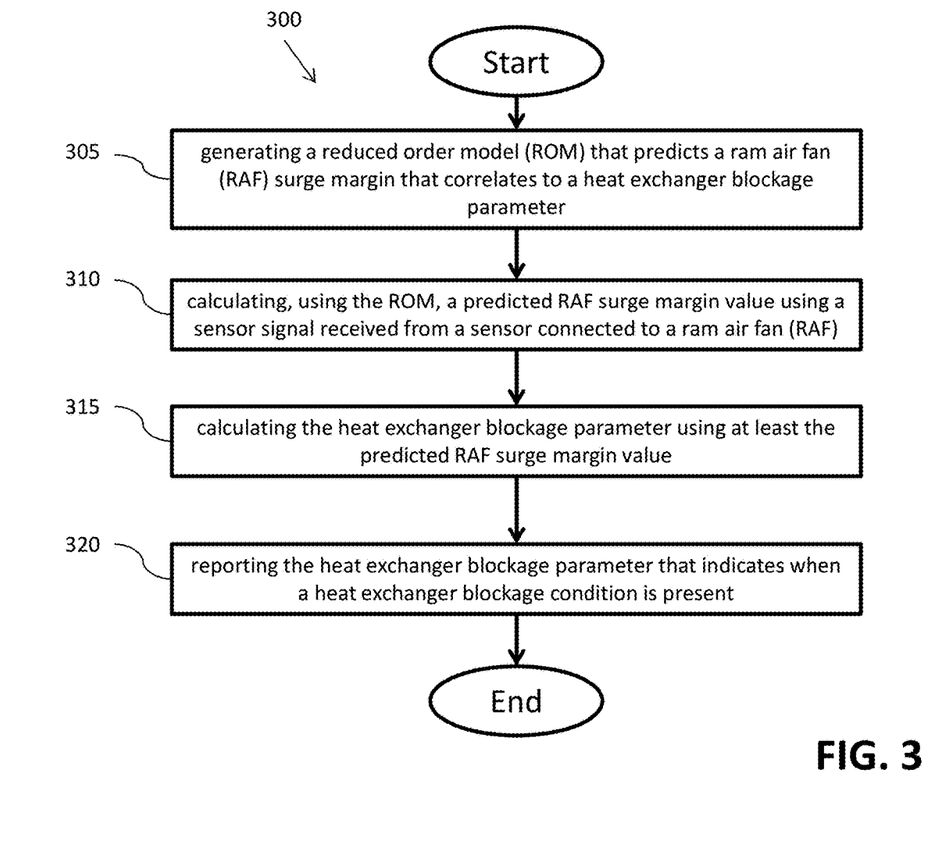
FIG. 3 illustrates a method for predicting heat exchanger blockage in an aircraft in accordance with one or more exemplary embodiments.

FIG. 3 illustrates a method 300 for predicting heat exchanger blockage in an aircraft in accordance with one or more exemplary embodiments. The method includes generating a reduced order model (ROM) that predicts a ram air fan (RAF) surge margin that correlates to a heat exchanger blockage parameter (operation 305). The method also includes calculating, using the ROM, a predicted RAF surge margin value using a sensor signal received from a sensor connected to a ram air fan (RAF) (operation 310). The method further includes calculating the heat exchanger blockage parameter using at least the predicted RAF surge margin value (operation 315). Finally, the method includes reporting, to a user, the heat exchanger blockage parameter that indicates when a heat exchanger blockage condition is present (operation 320). A user can include, a central control system, a user display, a user on the flight deck, a crew member elsewhere on the aircraft, or a ground crew located on the ground at an airport or other location that receives a transmission from the aircraft containing the heat exchanger blockage parameter. The user can then either directly instruct for an action to be taken. For example, a pilot can adjust the RAF and/or heat exchanger to avoid any possible damage. A ground crew can schedule a maintenance crew to meet the aircraft on the ground to expedite a repair. Alternatively, a user can simply take the report as notice and allow the system to automatically take action to adjust and schedule.

According to another embodiment calculating the heat exchanger blockage parameter is calculated by comparing the predicted RAF surge margin value with a threshold RAF surge margin value and a clean RAF surge margin value. Further, according to another embodiment, an increase in the predicted RAF surge margin value above the clean RAF surge margin value corresponds to an increase in the heat exchanger blockage parameter. In another embodiment, an increase in the predicted RAF surge margin value above the threshold RAF surge margin value corresponds to the heat exchanger blockage parameter indicating a heat exchanger blockage.

According to another embodiment, the heat exchanger blockage parameter is calculated by subtracting the predicted RAF surge margin value from the clean RAF surge margin value creating a first value, subtracting the threshold RAF sure margin from the clean RAF surge margin value creating a second value, and dividing the first value by the second value. According to another embodiment, the heat exchanger blockage parameter includes cleaning information for heat exchanger blockage cleaning.

Figure 4:
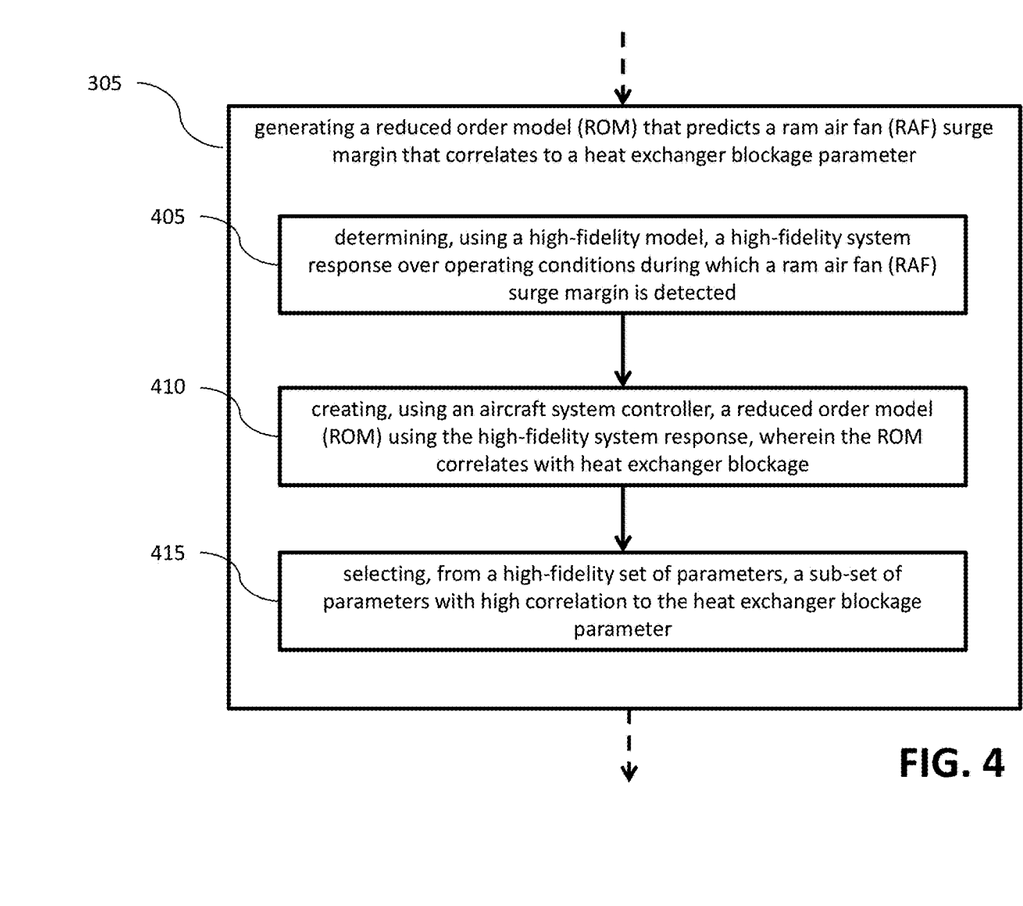
FIG. 4 illustrates additional operations for a method for predicting heat exchanger blockage in an aircraft in accordance with one or more exemplary embodiments.

FIG. 4 illustrates additional operations for a method 300 for predicting heat exchanger blockage in an aircraft in accordance with one or more exemplary embodiments.

Specifically, the method 300 operation of generating the ROM (operation 305) further includes determining, using a high-fidelity model, a high-fidelity system response over operating conditions during which the RAF surge margin is detected (operation 405). Additionally, the method 300 operation of generating the ROM (operation 305) further includes creating, using an aircraft system controller, the ROM using the high-fidelity system response, wherein the ROM correlates with heat exchanger blockage (operation 410). In other embodiment, the method 300 operation of generating the ROM (operation 305) further includes selecting, from a high-fidelity set of parameters, a sub-set of parameters with high correlation to the heat exchanger blockage parameter (operation 415). The sub-set of parameters have corresponding sensors in the aircraft system such that measurements from the sensors can be used to generate the predicted RAF surge margin value.

Figure 5:
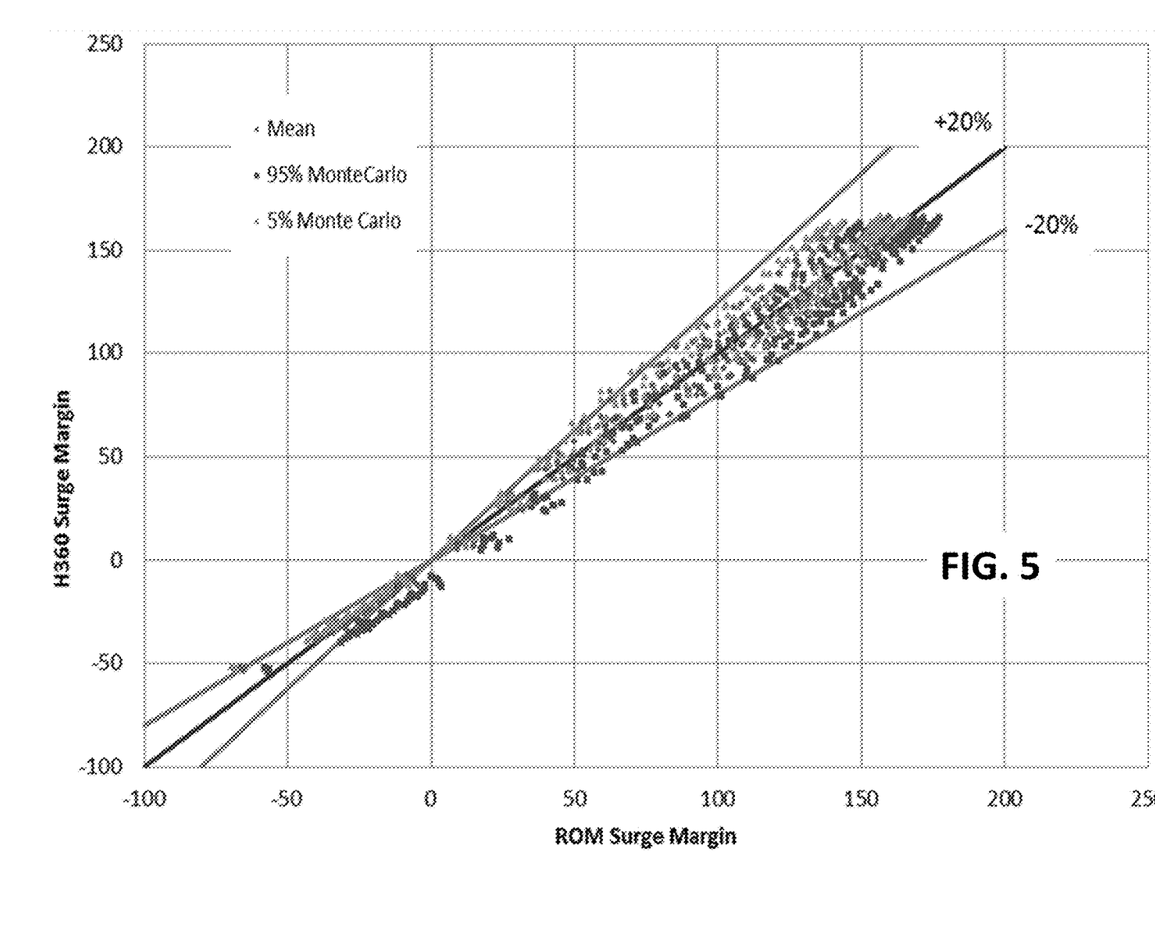
FIG. 5 illustrates a graphical representation of a comparison of ROM predicted RAF surge margin and detailed high-fidelity model in accordance with one or more embodiments.

FIG. 5 illustrates a graphical representation of a comparison of ROM predicted RAF surge margin and a detailed high-fidelity model in accordance with one or more embodiments. FIG. 5 shows a comparison between a surge margin predicted by the ROM using available aircraft sensors for a commercial jetliner and the detailed high-fidelity physics-based model. Note that there is reasonably good agreement between the two even when random sensor reading errors within the sensor tolerance are introduced. This validation of the ROM to the detailed model provides evidence that this method is viable for predicting RAF surge margin.

FIG. 5 also shows introduction of random perturbations within sensor tolerances to include effects of sensor accuracies and uncertainties. Results in FIG. 5 show that even when these uncertainties are introduced, the ROM is robust enough to give reliable predictions with reasonable accuracies for RAF surge margin.

According to one or more embodiments, a method and system for helping detect heat exchanger blockage uses a physics-based high-fidelity model, to mesh and determine a system response over the entire operating conditions of interest that one wishes to detect an RAF surge margin. With these results a Reduced Order Model (ROM) is then created by methodically selecting the parameters that show high correlation to RAF surge margin. The parameters utilized by the ROM have corresponding sensors in the system such that the measurement can be used as a part of the calculation. The parameters in the ROM may include items such as system pressures, system temperatures, valve positions, control references, or characteristics related to the ambient environment or aircraft operation.

According to one or more embodiments, ROM regression coefficients are determined. In an embodiment the ROM regression coefficients include nonlinear and interaction terms. According to another embodiment, the form of the ROM can take the form of the equation below:

$$y = b_0 + \Sigma_i b_i x_i^{c_i} + \Sigma_j b_j (X)_j^{c_j}$$

Where the $b_0$ is a constant, b is the multiplicative regression coefficients, c is the exponential regression coefficients, x are first order parameters, and X are the interaction terms (the product of any two first order parameters). Sensor variability/tolerance is included in analysis to ensure that the ROM is robust and not overly sensitive to sensor measurement inaccuracies and biases.

Further, according to another embodiment, this ROM is implemented into an aircraft such that the surge margin can be predicted by the controller during pack operation.

According to another embodiment, during operation the predicted surge margin can be compared to the surge margin of a clean heat exchanger at the same conditions. Based on the difference between the surge margin of a clean heat exchanger and the surge margin predicted using the ROM, the relative time to cleaning can be reported as a maintenance message. The heat exchanger blockage parameter, which can also be called a cleaning parameter, can be defined as:

$$Cleaning Parameter = \frac{Clean_{SurgeMargin} - Predicted_{SurgeMargin}}{Clean_{SurgeMargin} - MinAllow_{SurgeMargin}}$$

where $Clean_{SurgeMargin}$ is the surge margin at the same aircraft conditions if the heat exchangers were clean and $Predicted_{SurgeMargin}$ is the predicted surge margin as determined from the ROM.

Advantageously, embodiments described herein can provide time and cost saving related to excessively scheduled heat exchanger cleaning as well as providing additional safety monitoring. Specifically, by providing information to the operator about how relatively clean the heat exchangers are until the cleaning is absolutely necessary, the operators can better manage aircraft maintenance schedules and delay cleanings until they are actually necessary.

While the present disclosure has been described in detail in connection with only a limited number of embodiments, it should be readily understood that the present disclosure is not limited to such disclosed embodiments. Rather, the present disclosure can be modified to incorporate any number of variations, alterations, substitutions, combinations, sub-combinations, or equivalent arrangements not heretofore described, but which are commensurate with the scope of the present disclosure. Additionally, while various embodiments of the present disclosure have been described, it is to be understood that aspects of the present disclosure may include only some of the described embodiments.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description has been presented for purposes of illustration and description, but is not intended to be exhaustive or limited to the embodiments in the form disclosed. Many modifications and variations will be apparent to those of ordinary skill in the art without departing from the scope of the disclosure. The embodiments were chosen and described in order to best explain the principles of the disclosure and the practical application, and to enable others of ordinary skill in the art to understand various embodiments with various modifications as are suited to the particular use contemplated.

The present embodiments may be a system, a method, and/or a computer program product at any possible technical detail level of integration. The computer program product may include a computer readable storage medium (or media) having computer readable program instructions thereon for causing a processor to carry out aspects of the present disclosure.

the computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present disclosure may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Java, Smalltalk, C++, or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present disclosure.

Aspects of the present invention are described herein with reference to flowchart illustrations and/or block diagrams of methods, apparatus (systems), and computer program products according to embodiments. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Accordingly, the present disclosure is not to be seen as limited by the foregoing description, but is only limited by the scope of the appended claims.

What is claimed is:

1. A method for predicting heat exchanger blockage in an aircraft, the method comprising:
    generating a reduced order model (ROM) that predicts a ram air fan (RAF) surge margin that correlates to a heat exchanger blockage parameter;
    calculating, using the ROM, a predicted RAF surge margin value using a sensor signal received from a sensor connected to a ram air fan (RAF);
    calculating the heat exchanger blockage parameter using at least the predicted RAF surge margin value; and
    reporting, to a user, the heat exchanger blockage parameter that indicates when a heat exchanger blockage condition is present;
    wherein calculating the heat exchanger blockage parameter is calculated by comparing the predicted RAF surge margin value with a threshold RAF surge margin value and a clean RAF surge margin value.

2. The method of claim 1, wherein an increase in the predicted RAF surge margin value above the clean RAF surge margin value corresponds to an increase in the heat exchanger blockage parameter.

3. The method of claim 1, wherein an increase in the predicted RAF surge margin value above the threshold RAF surge margin value corresponds to the heat exchanger blockage parameter indicating a heat exchanger blockage.

4. The method of claim 1, wherein the heat exchanger blockage parameter is calculated by subtracting the predicted RAF surge margin value from the clean RAF surge margin value creating a first value, subtracting the threshold RAF sure margin from the clean RAF surge margin value creating a second value, and dividing the first value by the second value.

5. The method of claim 1, wherein generating the ROM comprises:
    determining, using a high-fidelity model, a high-fidelity system response over operating conditions during which the RAF surge margin is detected; and
    creating, using an aircraft system controller, the ROM using the high-fidelity system response, wherein the ROM correlates with heat exchanger blockage.

6. The method of claim 5, wherein generating the ROM further comprises:
    selecting, from a high-fidelity set of parameters, a sub-set of parameters with correlation to the heat exchanger blockage parameter,
    wherein the sub-set of parameters have corresponding sensors in the aircraft system such that measurements from the sensors can be used to generate the predicted RAF surge margin value.

7. The method of claim 1,
    wherein the heat exchanger blockage parameter includes cleaning information for heat exchanger blockage cleaning.

8. A system for predicting heat exchanger blockage in an aircraft, the system comprising:
    a heat exchanger and a corresponding heat exchanger blockage parameter;
    a ram air fan (RAF) and a corresponding RAF surge margin; and
    an aircraft system controller comprising:
    a memory having computer readable instructions; and
    one or more processors configured to execute the computer readable instructions, the computer readable instructions comprising:
    generating a reduced order model (ROM) that predicts the RAF surge margin that correlates to the heat exchanger blockage parameter;
    calculating, using the ROM, a predicted RAF surge margin value using a sensor signal received from a sensor connected to the ram air fan;
    calculating the heat exchanger blockage parameter using at least the predicted RAF surge margin value; and
    reporting, to a user, the heat exchanger blockage parameter that indicates when a heat exchanger blockage condition is present;
    wherein calculating the heat exchanger blockage parameter is calculated by comparing the predicted RAF surge margin value with a threshold RAF surge margin value and a clean RAF surge margin value.

9. The system of claim 8, wherein an increase in the predicted RAF surge margin value above the clean RAF surge margin value corresponds to an increase in the heat exchanger blockage parameter.

10. The system of claim 8, wherein an increase in the predicted RAF surge margin value above the threshold RAF surge margin value corresponds to the heat exchanger blockage parameter indicating the heat exchanger blockage condition.

11. The system of claim 8, wherein the heat exchanger blockage parameter is calculated by subtracting the predicted RAF surge margin value from the clean RAF surge margin value creating a first value, subtracting the threshold RAF surge margin from the clean RAF surge margin value creating a second value, and dividing the first value by the second value.

12. The system of claim 8, wherein generating the ROM comprises:
   determining, using a high-fidelity model, a high-fidelity system response over operating conditions during which the RAF surge margin is detected;
   creating, using an aircraft system controller, the ROM using the high-fidelity system response, wherein the ROM correlates with heat exchanger blockage.

13. The system of claim 12, wherein generating the ROM further comprises:
   selecting, from a high-fidelity set of parameters, a sub-set of parameters with correlation to the heat exchanger blockage parameter,
   wherein the sub-set of parameters have corresponding sensors in the aircraft system such that measurements from the sensors can be used to generate the predicted RAF surge margin value.

14. The system of claim 8, wherein the heat exchanger blockage parameter includes cleaning information for heat exchanger blockage cleaning.

15. A computer program product for predicting heat exchanger blockage in an aircraft, the computer program product comprising a non-transitory computer readable storage medium having program instructions embodied therewith, the program instructions executable by a processor to cause the processor to:
   generate a reduced order model (ROM) that predicts a ram air fan (RAF) surge margin that correlates to a heat exchanger blockage parameter;
   calculate, using the ROM, a predicted RAF surge margin value using a sensor signal received from a sensor connected to a ram air fan (RAF);
   calculate the heat exchanger blockage parameter using at least the predicted RAF surge margin value; and
   report, to a user, the heat exchanger blockage parameter that indicates when a heat exchanger blockage condition is present;
   wherein calculating the heat exchanger blockage parameter is calculated by comparing the predicted RAF surge margin value with a threshold RAF surge margin value and a clean RAF surge margin value,
   wherein an increase in the predicted RAF surge margin value above the clean RAF surge margin value corresponds to an increase in the heat exchanger blockage parameter,
   wherein an increase in the predicted RAF surge margin value above the threshold RAF surge margin value corresponds to the heat exchanger blockage parameter indicating a heat exchanger blockage, and
   wherein the heat exchanger blockage parameter is calculated by subtracting the predicted RAF surge margin value from the clean RAF surge margin value creating a first value, subtracting the threshold RAF sure margin from the clean RAF surge margin value creating a second value, and dividing the first value by the second value.

16. The computer program product of claim 15, having additional program instructions embodied therewith, the additional program instructions executable by the processor to cause the processor to:
   determine, using a high-fidelity model, a high-fidelity system response over operating conditions during which the RAF surge margin is detected; and
   create, using an aircraft system controller, the ROM using the high-fidelity system response, wherein the ROM correlates with heat exchanger blockage.

17. The computer program product of claim 15, having additional program instructions embodied therewith, the additional program instructions executable by the processor to cause the processor to:
   select, from a high-fidelity set of parameters, a sub-set of parameters with correlation to the heat exchanger blockage parameter,
   wherein the sub-set of parameters have corresponding sensors in the aircraft system such that measurements from the sensors can be used to generate the predicted RAF surge margin value.

\* \* \* \* \*